United States Patent
Yamaguchi

(10) Patent No.: US 6,645,304 B2
(45) Date of Patent: Nov. 11, 2003

(54) SUSCEPTORS FOR SEMICONDUCTOR-PRODUCING APPARATUSES

(75) Inventor: Shinji Yamaguchi, Ama-Gun (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/981,293

(22) Filed: Oct. 16, 2001

(65) Prior Publication Data
US 2002/0112820 A1 Aug. 22, 2002

(30) Foreign Application Priority Data
Oct. 23, 2000 (JP) ........................................ 2002-322479

(51) Int. Cl.[7] .................. H01L 21/00; C23C 16/00
(52) U.S. Cl. .................... 118/725; 118/728; 118/500; 156/345.52; 156/345.51; 219/444.1; 219/544; 392/416; 392/418
(58) Field of Search ................ 156/345.51, 345.52, 156/345.45, 345.44; 118/723 V, 724, 725, 728, 500; 219/444.1, 544; 392/416, 418; 361/234

(56) References Cited

U.S. PATENT DOCUMENTS

| | | | |
|---|---|---|---|
| 5,384,682 A | 1/1995 | Watanabe et al. | |
| 5,851,298 A | 12/1998 | Ishii | |
| 5,880,924 A | 3/1999 | Kumar et al. | |
| 5,886,863 A | 3/1999 | Nagasaki et al. | |
| 5,904,778 A | * 5/1999 | Lu et al. | 118/723 R |
| 6,133,557 A | * 10/2000 | Kawanabe et al. | 219/544 |
| 6,143,081 A | * 11/2000 | Shinriki et al. | 118/715 |
| 6,204,489 B1 | * 3/2001 | Katsuda et al. | 118/725 |

FOREIGN PATENT DOCUMENTS

| | | | | |
|---|---|---|---|---|
| EP | 0 798 775 A2 | 10/1997 | | |
| JP | 11260534 A | * 9/1999 | | H05B/3/20 |
| JP | 2000 044345 A | * 2/2000 | | H01L/21/68 |
| JP | 2000109383 A | * 4/2000 | | C04B/41/87 |

* cited by examiner

Primary Examiner—Gregory Mills
Assistant Examiner—Ram N Kackar
(74) Attorney, Agent, or Firm—Burr & Brown

(57) ABSTRACT

A susceptor made of a ceramic material for placing and heating an object to be processed, on a placing face thereof in a semiconductor-producing apparatus, includes a surface layer having the placing face, and a supporting layer integrated with the surface layer. The volume resistivity of the surface layer is lower than that of the supporting layer.

15 Claims, 1 Drawing Sheet

SUSCEPTORS FOR SEMICONDUCTOR-PRODUCING APPARATUSES

BACKGROUND OF THE INVENTION

1. Field of the Invention

The present invention relates to susceptors made of ceramic material for heating objects to be placed and processed on placing faces thereof in semiconductor-producing apparatuses.

2. Related Statement

Ceramic heaters in which a resistance heat-generating element is buried in a susceptor made of a ceramic material such as silicon nitride have been used for heating semiconductor wafers in semiconductor-producing apparatuses. Further, heaters in which a high frequency plasma-generating electrode is buried have been also used in the semiconductor-producing apparatuses. In such an apparatus, an object to be processed, such as a silicon wafer or a substrate for a liquid crystal, is placed on a susceptor, and the processed object is lifted with lift pins to release the supporting of the object after processing, and then conveyed.

The inventors discovered that when the wafer was placed on the susceptor, was subjected to a given processing under heating in a plasma environment, and was to be lifted with the lift pins to release the supporting of the object, the wafer might be positionally deviated by a few or several millimeters on the placing face of the susceptor through the wafer being absorbed onto the placing face of the susceptor.

It is therefore an object of the present invention to prevent positional deviation of a wafer through a phenomenon that the wafer is absorbed onto the placing face of the susceptor when the wafer is supported and processed under heating on the susceptor and the wafer is released from being supported.

SUMMARY OF THE INVENTION

The present invention relates to the susceptor made of a ceramic material for placing and heating an object to be processing, on a placing face thereof in a semiconductor-producing apparatus, said susceptor comprising a surface layer having said placing face, and a supporting layer integrated with said surface layer, a volume resistivity of the surface layer being lower than that of the supporting layer.

The present inventors succeeded in preventing the positional deviation of the object due to the absorbing phenomenon of the object onto the placing face of the susceptor at a time of releasing the supporting of the object thereon by the provision of the surface layer having a lower volume resistivity on the ceramic susceptor.

The present invention can be favorably applied particularly to placing and heating the object to be processed in a plasma environment.

These and other objects, features and advantages of the invention will be appreciated upon reading of the following description of the drawings, with the understanding that some modifications, variations and changes of the invention could be easily made by the skilled person in the art to which the invention pertains.

BRIEF DESCRIPTION OF THE DRAWING

For a better understanding of the invention, reference is made to the attached drawing, wherein.

Figure 1:
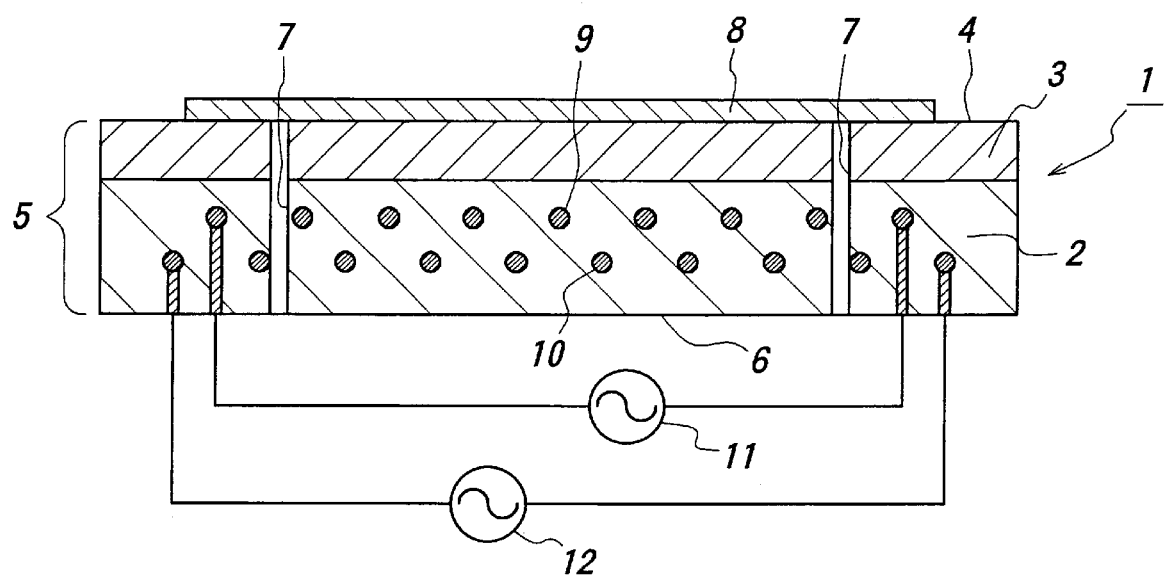
FIG. 1 is a FIGURE for schematically illustrating a susceptor according to one embodiment of the present invention.

A method by which the object supported on the susceptor is heated is not limited to any particular one. For example, the susceptor can be heated with infrared rays. Another heater may be placed at a rear face side of the susceptor. The present invention is effected particularly in a case where a heat-generating element is buried in the supporting layer, because the object is more likely to be positionally deviated in this case.

A reason is not clear, but the present invention is also effective particularly for a case where a high frequency plasma-generating plasma is buried in the supporting layer, because the object is more likely deviated in this case.

The use temperature of the susceptor is not particularly limited, but not less than 250° C. is particularly preferable for the present invention. No particular upper limit exists, either, but not more than 650° C. is preferable.

The volume resistivity of each of the surface layer and the supporting layer may be appropriately determined depending upon the chucking response, leakage current, etc. at the use temperature. However, it is preferable that the volume resistivities of the surface layer and the supporting layer are not more than $1 \times 10^8$ Ω·cm and not less than $1 \times 10^8$ Ω·cm, respectively at an intended use temperature.

The volume resistivity of the supporting layer is preferably not less than $1 \times 10^8$ Ω·cm, most preferable not less than $1 \times 10^{10}$ Ω·cm at the use temperature so as to enhance the plasma-generating efficiency, for example.

The volume resistivity of the supporting layer is preferably not less than 10 times, more preferably not less than 1000 times as much as that of the surface layer at the use temperature.

The surface layer and the supporting layer of the ceramic susceptor are preferably integrated and made of the same kind of ceramic materials, so that the surface layer is prevented from being peeled from the supporting layer and reduction in the flatness of the placing face of the surface layer due to warping of the susceptor is prevented.

The same kind of the ceramic materials means the ceramic materials of which main components are the same, while additive(s) may be different between them. Preferably, not less than 80 wt % of the component is the same between both the layers. The main component is preferably aluminum nitride, silicon nitride, alumina, zirconia or boron nitride, more preferably aluminum nitride.

In each of the ceramic materials, a method is known for controlling the volume resistivity itself. Therefore, it is not described in detail, but the following materials are particularly preferred for aluminum nitride.

As aluminum nitride having relatively high volume resistivity, aluminum nitride-based sintered bodies composed mainly of aluminum nitride with an aluminum nitride polycrystal structure and containing not less than 100 ppm and not more than 500 ppm of lithium or magnesium or a lithium compound or a magnesium compound may be recited, for example.

In aluminum nitride, the content of rare earth elements is not less than 150 ppm and not more than 0.5 wt % when calculated in the form of oxide(s), while the content of impurities excluding the rare earth element(s) is not more than 900 ppm. The aluminum nitride sintered body preferably has a main peak in a wavelength region of 350 nm to 370 nm of a spectrum with a cathode luminescence. Since this sintered body has a volume resistivity of not less than $1.0 \times 10^6$ Ω·cm and not more than $1.0 \times 0^{12}$ Ω·cm, and the content of metallic impurities is small, it is suitable for the semiconductor-producing apparatus.

The thickness of the surface layer is not limited, but not less than 10 μm is preferable, and not less than 1 mm is particularly preferable. No upper limitation is posed on the thickness of the surface layer, but not more than 20 mm is preferable.

The thickness of the supporting layer is not limited, but 3 to 50 mm is particularly preferable.

The thickness of the surface layer is preferably not more than ¼ of that of the supporting layer. Further increase in the thickness of the surface layer relative to that of the supporting layer is unfavorable, because the wafer is likely to be influenced with the plasma density distribution formed above the wafer.

According to a preferred embodiment of the present invention, a through hole into which a releasing member for releasing the placement of the object on the susceptor is opened at the placing face of the susceptor. In this case, the wafer supported on the placing face of the susceptor is lifted from the lower side with the releasing member, so that the object is more likely to be positionally deviated.

No material limitation is not posed upon the heat-generating element or the high frequency plasma-generating electrode being able to be buried in the susceptor. However, metallic molybdenum or a molybdenum alloy is preferred. As the molybdenum alloy, alloys between molybdenum and tungsten, aluminum or platinum are preferred. No upper limitation is particularly posed upon the rate of molybdenum on in the molybdenum alloy. It may be increased to 100 wt % (pure metal). The lower limit for the molybdenum rate is preferably 50 wt %. Besides metallic molybdenum and the molybdenum alloys, pure metals such as tungsten, aluminum or platinum or alloys thereof are preferred.

No limitation is posed upon the configuration of the high frequency plasma-generating electrode. The prevent invention is effective particularly for a case where the electrode is of a net-like shape or in the form of a punched sheet, because the above-mentioned problems are likely to occur.

In the present invention, the surface layer is in the form of a planar shape having a certain thickness. For this purpose, the surface layer may be a film formed on the supporting layer, and preferably the surface layer itself is a ceramic bulk body.

The susceptor according to the present invention may be produced by any of the following methods, for example.

(1) A powdery ceramic material for a supporting layer is press molded, a high frequency plasma-generating electrode and/or a heat-generating element is placed on the molded body, and the powder for the supporting layer is additionally charged on the resultant, followed by press molding. Then, a ceramic powder for the surface layer is charged onto the molded body, followed by press molding. Thereby, a molded body is obtained. This molded body is integrally fired to obtain a fired body, which is worked into a susceptor.

(2) A powdery ceramic material for a supporting layer is press molded, a high frequency plasma-generating electrode and/or a heat-generating element is placed on the molded body, and the powder for the supporting layer is additionally charged on the resultant, followed by press molding. A ceramic bulk body for a surface layer is placed on the molded powder body, and the molded powder body and the bulk body are integrally fired to obtain a fired body, which is worked.

(3) A powdery ceramic material for a supporting layer is press molded, a high frequency plasma-generating electrode and/or a heat-generating element is placed on the molded body, and the powder for the supporting layer is additionally charged on the resultant, followed by press molding. The resultant molded body is integrally fired to obtain a fired body. A ceramic bulk body for a surface layer is joined to this fired body, and the joined body is worked into a given shape of a susceptor. The joining method may be soldering, glass bonding, resin bonding or solid phase diffusion.

FIG. 1 schematically illustrates a susceptor 1 according to one embodiment of the present invention. The susceptor 1 comprises a supporting layer 2 and a surface layer 3. A wafer 8 is supported on a placing face 4 of the surface layer 3. Inside the supporting layer 2 are buried a high frequency plasma-generating electrode 9 and a resistance-heating element 10. A reference numeral 5 denotes a susceptor body. The electrode 9 is connected to an electric power source 11, while the heat-generating element 10 is connected to an electric power source 12. Through holes 7 are formed from the placing face 4 to the rear surface of the susceptor body.

EXAMPLE

Comparative Example 1

Powdery aluminum nitride obtained by a reduction nitriding method was used, and granulated powder was obtained by adding an acrylic resin binder to the aluminum nitride powder and granulating the mixture with a spray granulator. A discoid preliminarily molded body having a diameter of 230 mm and a thickness of 30 mm was prepared by molding the granulated powder. At that time, an electrode 9 and a resistance heat-generating element 10 were buried in the molded body. The molding pressure was set at 200 kg/cm$^2$ at that time. As the electrode 9, a metal net made of molybdenum was used. As the metal net, a metal net in which molybdenum wires having a diameter of 0.20 mm were knitted at a density of 50 wires per inch was used.

The molded body was sintered, thereby obtaining a susceptor having a diameter of 230 mm and a thickness of 15 mm. The susceptor was placed in a chamber, and a silicon wafer was placed on the susceptor. The interior of the chamber was evacuated to vacuum at $10^{-3}$ Torr or less, and a fluorine-based gas was introduced into the chamber. Electric power was fed to the electrode to generate a plasma of the fluorine-based gas. Simultaneously with this, electric power was supplied to the resistance heat-generating element to heat the silicon wafer to a given temperature. Lift pins were raised through through holes 7 (three locations) to lift the silicon wafer and release the supporting thereof. One hundred silicon wafers were subjected to this experiment. Positional deviation of the wafers was confirmed through view port hole. The number of the wafers having suffered from such positional deviations was counted. Results are shown in Table 1.

TABLE 1

| Wafer temperature (° C.) | Volume resistivity of AlN (Ω · cm) | Number of wafers positionally deviated |
| --- | --- | --- |
| 100 | $2 \times 10^{15}$ | 0 |
| 200 | $1 \times 10^{14}$ | 5 |
| 250 | $1 \times 10^{13}$ | 87 |
| 650 | $3 \times 10^{8}$ | 23 |
| 700 | $1 \times 10^{6}$ | 0 |

Example 1

A susceptor was produced in the same manner as in Comparative Example 1, provided that an electrode 9 and a resistance heat-generating element 10 were buried in a supporting layer, and a separate surface layer made of aluminum nitride was produced. The thickness of the surface layer was 1.5 mm.

A joining surface of the supporting layer and that of the surface layer were finely polished, and then the supporting layer and the surface layer were joined to each other, while an aqueous solution of yttria was interposed between them and heating the layers. The thus obtained susceptor was subjected to the same experiments as in Comparative Example 1. Results are shown in Table 2.

TABLE 2

| Wafer temperature (° C.) | Volume resistivity of surface layer (Ω · cm) | Volume resistivity of supporting layer (Ω · cm) | Number of wafers positionally deviated |
| --- | --- | --- | --- |
| 200 | $8 \times 10^7$ | $1 \times 10^{14}$ | 0 |
| 250 | $1 \times 10^7$ | $1 \times 10^{13}$ | 0 |
| 650 | $1 \times 10^5$ | $1 \times 10^8$ | 0 |
| 700 | $5 \times 10^4$ | $1 \times 10^6$ | 0 |

Example 2

A susceptor was produced in the same manner as in Example 1, provided that the volume resistivity of each of a surface layer and a supporting layer was varied as shown in Table 3.

Table 3

| Wafer temperature (° C.) | Volume resistivity of surface layer (Ω · cm) | Volume resistivity of supporting layer (Ω · cm) | Number of wafers positionally deviated |
| --- | --- | --- | --- |
| 200 | $7 \times 10^8$ | $1 \times 10^{15}$ | 3 |
| 250 | $1 \times 10^8$ | $9 \times 10^{14}$ | 0 |
| 650 | $5 \times 10^6$ | $8 \times 10^9$ | 0 |
| 700 | $8 \times 10^5$ | $5 \times 10^8$ | 0 |

As having been described above, according to the susceptor of the present invention, when the wafer is supported on the susceptor and processed hereon under heating and then the supporting of the wafer is released, the positional deviation of the wafer from the placing face of the susceptor through adsorption phenomenon can be prevented.

What is claimed is:

1. A susceptor made of a ceramic material for placing and heating an object to be processed on a placing face thereof in a semiconductor-producing apparatus, comprising a surface layer having said placing face, a supporting layer integrated with said surface layer, said surface and supporting layers each comprising AlN, wherein a volume resistivity of the surface layer is lowered than that of the supporting layer, and a heat generating element positioned entirely within the supporting layer, wherein said susceptor has no electrostatically chucking function.

2. The susceptor set forth in claim 1, wherein said susceptor is adapted to place and heat said object in a plasma environment.

3. The susceptor set forth in claim 2, further comprising a high frequency plasma-generating electrode buried in said supporting layer.

4. The susceptor set forth in claim 2, wherein said susceptor has a use temperature of 250° C. to 650° C.

5. The susceptor set forth in claim 2, wherein the volume resistivities of the surface layer and the supporting layer are not more than $1 \times 10^8$ Ω·cm and not less than $1 \times 10^8$ Ω·cm, respectively, at an intended use temperature.

6. The susceptor set forth in claim 5, wherein the volume resistivity of the supporting layer is not less than 1000 times as much as that of the surface layer at the use temperature.

7. The susceptor set forth in claim 5, wherein the volume resistivity of the supporting layer is not less than 10 times as much as that of the surface layer at the use temperature.

8. The susceptor set forth in claim 2, wherein said surface layer and said supporting layer are made of a same kind of a ceramic material.

9. The susceptor set forth in claim 2, wherein a through-hole into which a releasing member for releasing supporting of the object onto the susceptor is opened at the placing face.

10. The susceptor set forth in claim 1, further comprising a high frequency plasma-generating electrode buried in said supporting layer.

11. The susceptor set forth in claim 1, wherein said susceptor has a use temperature of 250° C. to 650° C.

12. The susceptor set forth in claim 1, wherein the volume resistivities of the surface layer and the supporting layer are not more than $1 \times 10^8$ Ω·cm and not less than $1 \times 10^8$ Ω·cm, respectively, at an intended use temperature.

13. The susceptor set forth in claim 12, wherein the volume resistivity of the supporting layer is not less than 10 times as much as that of the surface layer at the use temperature.

14. The susceptor set forth in claim 12, wherein the volume resistivity of the supporting layer is not less than 1000 times as much as that of the surface layer at the use temperature.

15. The susceptor set forth in claim 1, wherein a through-hole into which a releasing member for releasing supporting of the object onto the susceptor is opened at the placing face.

* * * * *

UNITED STATES PATENT AND TRADEMARK OFFICE
CERTIFICATE OF CORRECTION

PATENT NO.     : 6,645,304 B2
DATED          : November 11, 2003
INVENTOR(S)    : Shinji Yamaguchi It is certified that error appears in the above-identified patent and that said Letters Patent is hereby corrected as shown below:

Column 2,
Line 1, please add the title -- DETAILED DESCRIPTION OF THE INVENTION --

Column 3,
Line 23, please change "being able to be" to -- that is --
Line 28, please delete "on"

Signed and Sealed this

Thirtieth Day of December, 2003

JAMES E. ROGAN
*Director of the United States Patent and Trademark Office*